United States Patent
Liu et al.

(10) Patent No.: US 12,028,077 B1
(45) Date of Patent: Jul. 2, 2024

(54) PHASE DETECTOR CIRCUIT FOR MULTI-LEVEL SIGNALING

(71) Applicant: Apple Inc., Cupertino, CA (US)

(72) Inventors: Wenbo Liu, Cupertino, CA (US);
Gokce Gurun, San Jose, CA (US);
Ajay M. Rao, San Jose, CA (US);
Sanjeev K. Maheshwari, Fremont, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 18/172,738

(22) Filed: Feb. 22, 2023

(51) Int. Cl.
*H03K 5/24* (2006.01)
*H03K 3/037* (2006.01)
*H03K 19/20* (2006.01)

(52) U.S. Cl.
CPC .............. *H03K 5/24* (2013.01); *H03K 3/037* (2013.01); *H03K 19/20* (2013.01)

(58) Field of Classification Search
CPC ..... H03L 7/06; H03L 7/08; H03L 7/16; H04L 7/033; H04L 7/0331
USPC ................................................. 375/375–376
See application file for complete search history.

(56) References Cited

U.S. PATENT DOCUMENTS

| | | | |
|---|---|---|---|
| 9,455,848 B1 | 9/2016 | Zhang et al. | |
| 11,277,254 B2 | 3/2022 | Lee et al. | |
| 11,398,826 B1 * | 7/2022 | Sengupta | H03L 7/0807 |
| 2004/0091073 A1 * | 5/2004 | Smith | H04L 7/0331 |
| | | | 375/375 |
| 2018/0152285 A1 * | 5/2018 | Shih | H04L 7/0087 |
| 2019/0288831 A1 * | 9/2019 | Kobayashi | H04L 7/0334 |
| 2021/0342151 A1 * | 11/2021 | Kim | G06F 9/30029 |
| 2022/0329247 A1 | 10/2022 | Ierssel et al. | |

* cited by examiner

*Primary Examiner* — Quan Tra
(74) *Attorney, Agent, or Firm* — Kowert, Hood, Munyon, Rankin & Goetzel, P.C.; Dean M. Munon

(57) ABSTRACT

A phase detector circuit for use with a multi-level signaling communication protocol on a serial communication link is disclosed. The phase detector circuit employs multiple phase and logic circuits to detect data state changes between adjacent ones of voltage levels corresponding to different data states in the communication protocol, and generates early/late signals using the detected data state changes. The phase detector circuit statistically filters data state transitions between non-adjacent voltage levels to improve phase locking and reduce recovered clock jitter.

20 Claims, 11 Drawing Sheets

PHASE DETECTOR CIRCUIT FOR MULTI-LEVEL SIGNALING

BACKGROUND

Technical Field

This disclosure relates to the field of high-speed communication interface design and, in particular, to high-speed sampler circuits.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel and devices coupled to the communication channel may induce reflections of the transmitted signal, which may degrade subsequently transmitted signals corresponding to other data bits.

Figure 1:
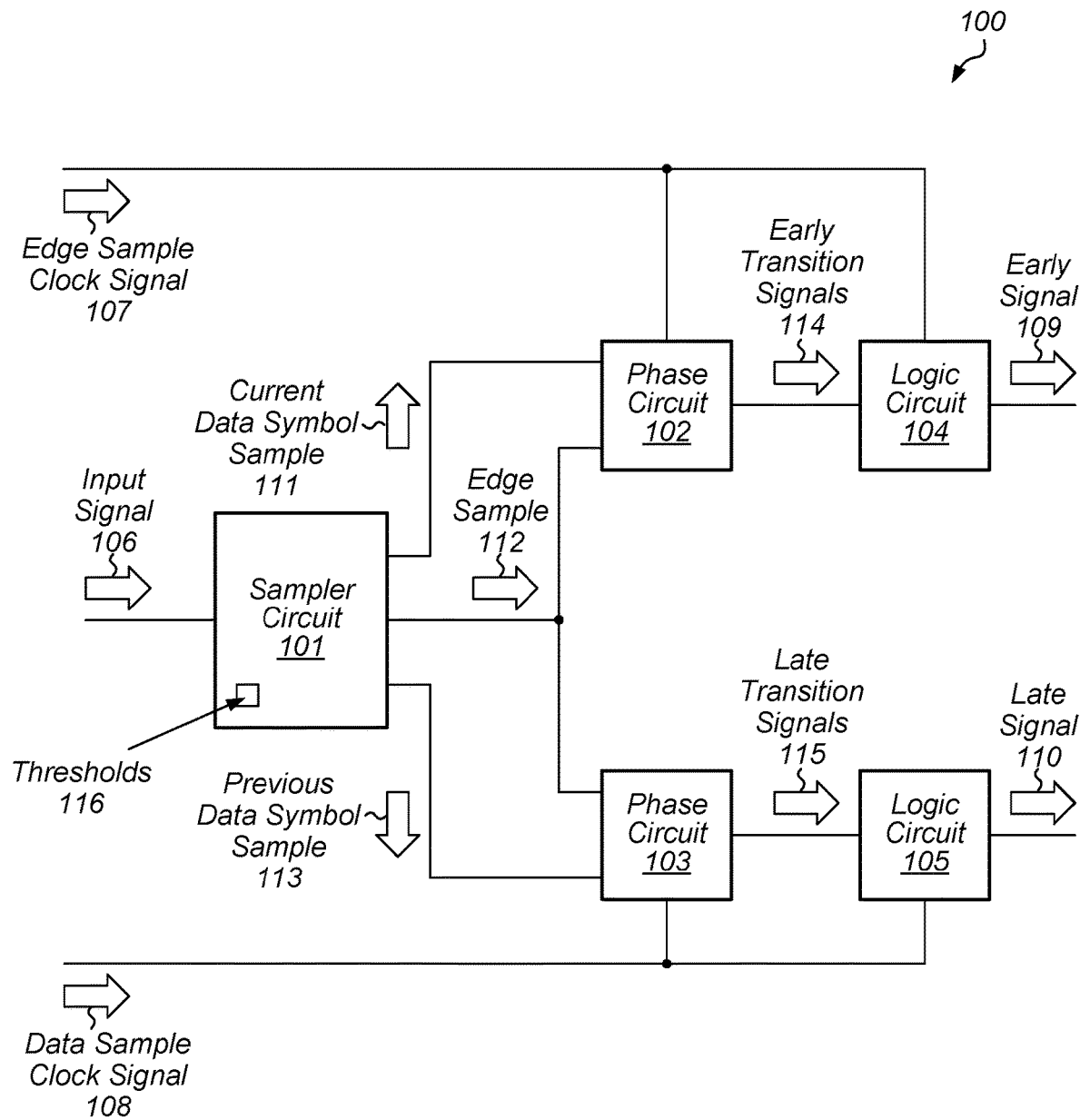
FIG. 1 is a block diagram of an embodiment of a phase detector circuit for a receiver circuit in a computer system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed but, on the contrary, the intention is to cover all modifications, equivalents and alternatives falling within the spirit and scope of the appended claims.

DETAILED DESCRIPTION OF EMBODIMENTS

Computing systems typically include a number of interconnected integrated circuits. In some cases, the integrated circuits may communicate using communication channels or links to transmit and receive signals that encode data symbols. The communication channels may support parallel communication, in which multiple data symbols are transmitted in parallel, or serial communication, in which data symbols are transmitted one bit at a time in a serial fashion. A given data symbol can correspond to a single bit of data or multiple bits of data.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

When a transmitted signal is received, a sampler circuit can be employed to sample the received signals at particular points of time. In some cases, the sampling points are determined by a clock signal that is transmitted along with the data. In other cases, a clock is recovered from the received signal and the recovered clock signal is used to sample the signals.

Various techniques can be employed to recover a clock signal from a serial data stream. For example, in some cases a phase-locked loop (PLL) circuit is used to generate the recovered clock signal. The phase of the recovered clock signal is adjusted relative to data transitions in the serial data stream. Some systems employ multiple recovered clock signals that allow the data stream to be sampled at transitions in the data stream as well as in the middle of the data eyes of the serial data stream.

In some communication protocols, e.g., PAM3, different discrete voltage levels correspond to different data symbols. As different data symbols are transmitted, the voltage level of the transmitted signal transition between the different discrete voltage levels. In some cases, a change in data symbol can result in a switch between two adjacent voltage levels (referred to as a "minor crossing"). In other cases, a change in data symbol can result in a switch between the maximum voltage level and the minimum voltage level (referred to as a "major crossing").

A major crossing can be twice as large as a minor crossing and can occur at different times than the minor crossing. Current phase detectors track both minor and major crossings, and attempt to lock the recovered clock using both crossings. Since the major crossings can be out-of-phase with the minor crossings, using both crossing can result in jitter in the recovered clock signal which can increase the bit error rate for recovering the data symbols encoded in the transmitted signal.

The embodiments described herein employ multiple phase circuits that are used to track transitions for the different data eyes (e.g., an upper data eye and a lower data eye for a PAM3 interface) while statistically filtering the phase information associated with the major crossings. The resultant phase information for the different data eyes are combined together to generate early and late signals used for clock recovery. By filtering out the phase information associated with the major crossings, jitter in the recovered clock signal is reduced, which can improve the bit error rate of a receiver circuit.

A block diagram of a phase detector circuit is depicted in FIG. 1. As illustrated, phase detector circuit 100 includes sampler circuit 101, phase circuit 102, phase circuit 103, logic circuit 104, and logic circuit 105.

Sampler circuit 101 is configured to receive input signal 106 and generate current data symbol sample 111, edge sample 112, and previous data symbol sample 113 using input signal 106. In various embodiments, input signal 106 may encode a plurality of data symbols, each of which may correspond to one or more bits. In some embodiments, sampler circuit 101 may use either or both of edge sample clock signal 107 and data sample clock signal 108 to generate current data symbol sample 111, edge sample 112, and previous data symbol sample 113. It is noted that current data sample 111, edge sample 112, and previous data symbol sample 113 may each include multiple bits. It is further noted that sampler circuit 101 may include one or more registers or other storage circuit to store data samples in order to allow the use of a current data sample, and a previously sampled data symbol.

To generate current data symbol sample 111, edge sample 112, and previous data symbol sample 113, sampler circuit 101 may be further configured to compare a voltage level of input signal 106 to one or more of thresholds 116. In some embodiments, thresholds 116 may correspond to voltage levels that specify a separation between voltage regions that correspond to different data symbol values as defined in a communication protocol such as PAM3.

Phase circuit 102 is configured to generate early transition signals 114 using edge sample 112, current data symbol sample 111, and edge sample clock signal 107. As described below, phase circuit 102 may include multiple bang-bang phase detector circuits to generate corresponding early transition signals 114 using corresponding portions of edge sample 112 and current data symbol sample 111. For example, one of early transition signals 114 may be generated using one or more of the most-significant-bits (MSBs) of edge sample 112 and current data symbol sample 111, while another of early transition signals 114 may be generated using one or more of the least-significant-bits (LSBs) of edge sample 112 and current data symbol sample 111.

Phase circuit 103 is configured to generate late transition signals 115 using edge sample 112, previous data symbol sample 113, and data sample clock signal 108. As with phase circuit 102, phase circuit 103 may include multiple bang-bang phase detector circuits to generate corresponding late transition signals 115 using corresponding portions of edge sample 112 and previous data symbol sample 113. For example, one of late transition signals 115 may be generated using one or more most-significant-bits (MSBs) of edge sample 112 and previous data symbol sample 113, while another of late transition signals 115 may be generated using one or more least-significant-bits (LSBs) of edge sample 112 and previous data symbol sample 113.

Logic circuit 104 is configured to generate early signal 109 using early transition signals 114. As described below, to generate early signal 109, logic circuit 104 may be further configured to perform a logical-OR operation of early transition signals 114. In the case of a PAM3 communication protocol, this logical-OR operation can be expressed as shown in Equation 1, where E corresponds to early signal 109, $X_k$ corresponds to edge sample 112, and $D_k$ corresponds to current data symbol sample 111.

$$E = MSB(X_k) \wedge \overline{MSB(D_k)} + LSB(X_k) \wedge \overline{LSB(D_k)} \quad (1)$$

Logic circuit 105 is configured to generate late signal 110 using late transition signals 115. As described below, to generate late signal 110, logic circuit 105 may be further configured to perform a logical-OR operation of late transition signals 115. In the case of a PAM3 communication protocol, this logical-OR operation can be expressed as shown in Equation 2, where L corresponds to late signal 110, $X_k$ corresponds to edge sample 112, and $D_{k-1}$ corresponds to previous data symbol sample 113.

$$L = MSB(X_k) \wedge \overline{MSB(D_{k-1})} + LSB(X_k) \wedge \overline{LSB(D_{k-1})} \quad (2)$$

As described below, by using different portions of current data symbol sample 111, edge sample 112, and previous data symbol sample 113, major crossings between data states in input signal 106 can be filtered out, allowing a clock recovery circuit to phase lock to just the minor crossings between data states, thereby reducing jitter in recovered clocks and reducing the bit error rate.

Figure 2:
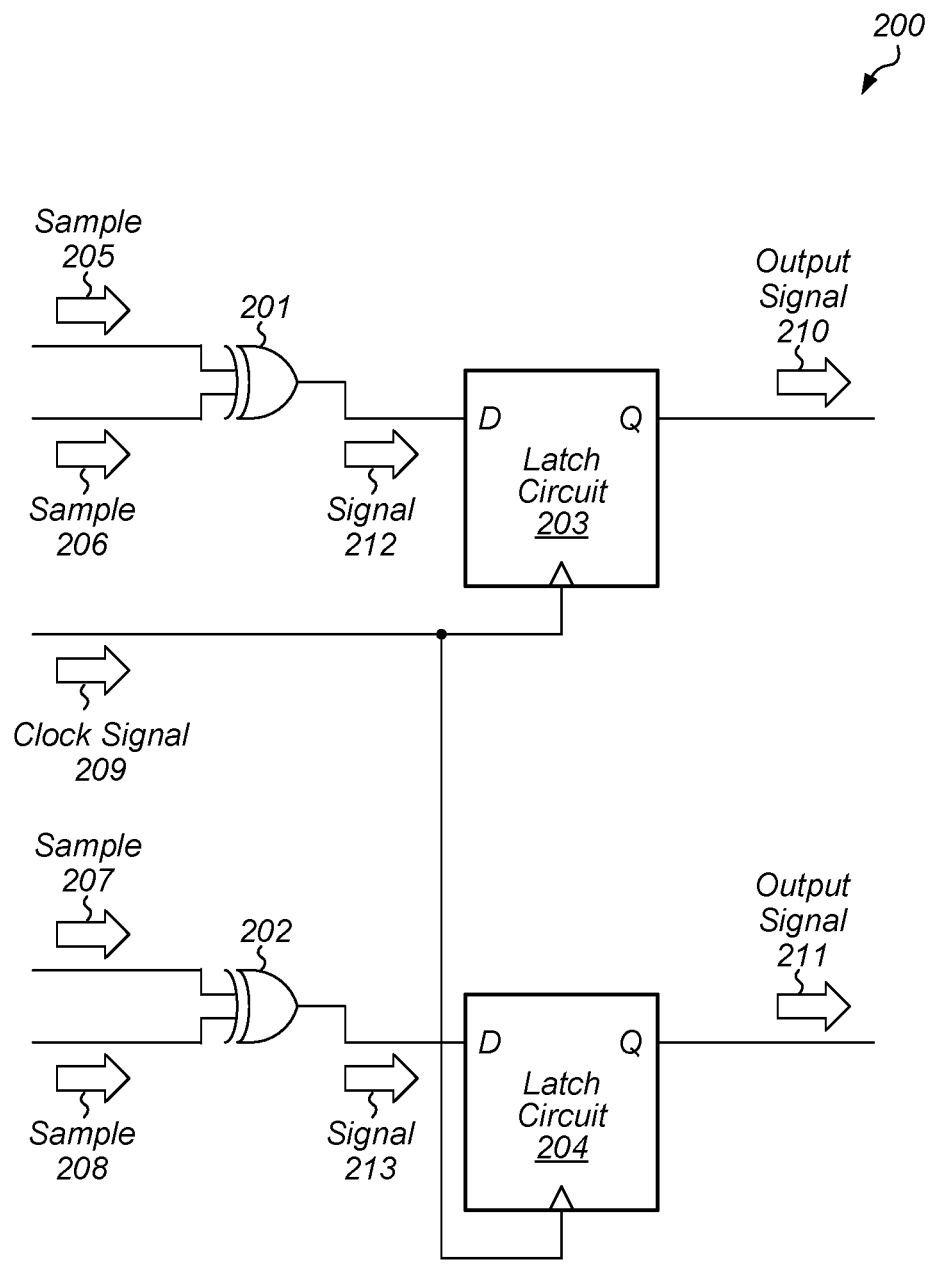
FIG. 2 is a block diagram of an embodiment of a phase circuit.

Turning to FIG. 2, a block diagram of an embodiment of a phase circuit is depicted. Phase circuit 200, which may, in various embodiments, correspond to either of phase circuits 102 or 103 as depicted in FIG. 1, includes logic gates 101 and 202, and latch circuits 203 and 204.

Logic gate 201 is configured to generate signal 212 using sample 205 and sample 206. In various embodiments, sample 205 may correspond to a portion of current data symbol sample 111, and sample 206 may correspond to a portion of edge sample 112. For example, in some embodiments, the portion of current data symbol sample 111 may correspond to a MSB of current data symbol sample 111, and the portion of edge sample 112 may correspond to a MSB of edge sample 112.

Logic gate 202 is configured to generate signal 213 using sample 207 and sample 208. In various embodiments, sample 207 may correspond to a portion of previous data symbol sample 113, and sample 206 may correspond to a portion of edge sample 112. For example, in some embodiments, the portion of previous data symbol sample 113 may correspond to a LSB of previous data symbol sample 113, and the portion of edge sample 112 may correspond to a LSB of edge sample 112.

To generate signals 212 and 213, logic gates 201 and 202 may be configured to perform an exclusive-OR operation. In various embodiments, logic gates 201 and 202 may be implemented using respective sets of logic gates arranged to perform the exclusive-OR operation. Alternatively, logic gates 201 and 202 may be implemented as complex logic gates that use any suitable arrangement of p-channel and n-channel metal-oxide semiconductor field-effect transistors (MOSFETs), fin field-effect transistors (FinFETs), gate-all-around field-effect transistors (GAAFETs), or any other suitable transconductance devices.

Latch circuit 203 is configured to sample and hold a logic state of signal 212 in response to an activation of clock signal 209 to generate output signal 210. In a similar fashion, latch circuit 204 is configured to sample and hold a logic state of signal 213 to in response to the activation of clock signal 209 to generate output signal 211. In various embodiments, output signal 210 and output signal 211 may be included in either early transitions signals 114 or late transition signals 115.

As used herein, when a signal is activated, it is set to a logic or voltage level that activates a load circuit or device. The logic level may be either a high logic level or a low logic level depending on the load circuit. For example, an active state of a signal coupled to a p-channel MOSFET is a low logic level (referred to as an "active low signal"), while an active state of a signal coupled to an n-channel MOSFET is a high logic level (referred to as an "active high signal").

Latch circuits 203 and 204 may be implemented as D-type flip-flop circuits or any other suitable storage circuits. It is noted that latch circuits 203 and 204 may be implemented using CMOS or any other suitable technology.

It is noted that in the embodiment of FIG. 2, phase circuit 200 is configured to generate two output signals. In other embodiments, additional logic gates and latch circuits may be included and phase circuit 200 may be configured to generate any suitable number of output signals.

Figure 3:
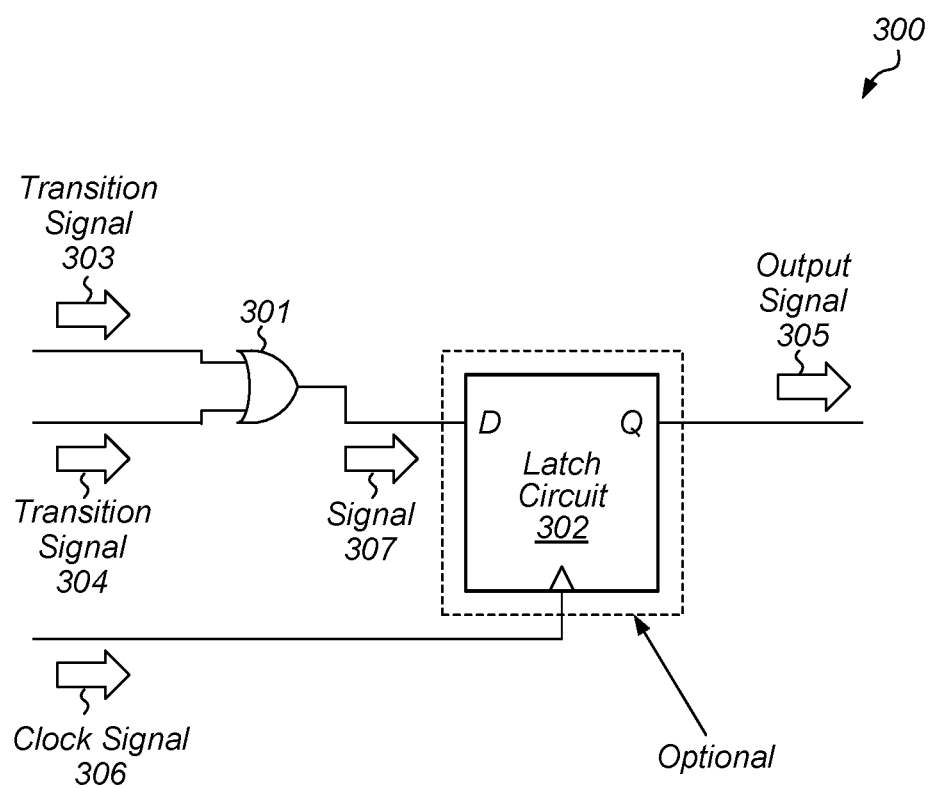
FIG. 3 is a block diagram of another embodiment of logic circuit.

Turning to FIG. 3, a block diagram of an embodiment of a logic circuit for use in a phase detector circuit is depicted. As illustrated, logic circuit 300 includes OR-gate 301 and optional latch circuit 302. In various embodiments, logic circuit 300 may correspond to either of logic circuits 104 or 105 as depicted in FIG. 1.

OR-gate 301 is configured to generate signal 307 using transition signals 303 and 304. In various embodiments, transition signals 303 and 304 may correspond to either early transition signals 114 or late transitions signals 115. To generate signal 307, OR-gate 301 may be further configured to perform a logical-OR operation on transition signals 303 and 304. In some embodiments, OR-gate 301 may be implemented using multiple p-channel and n-channel MOSFETs, or any other suitable switching devices.

In some cases, it is necessary to re-time signal 307 so that it coincides with either edge sample clock signal 107 or data sample clock signal 108. To accomplish such re-timing, latch circuit 302 may be employed. In various embodiments, latch circuit 302 is configured to sample and hold a logic state of signal 307 in response to an activation of clock signal 306 to generate output signal 305. In some embodiments, output signal 305 may correspond to either early signal 109 or late signal 110, while clock signal 306 may correspond to either edge sample clock signal 107 or data sample clock signal 108.

In various embodiments, latch circuit 302 may be implemented as a D-type flip-flop circuit or any other suitable storage circuit. It is noted that latch circuit 302 may be implemented using CMOS or any other suitable technology.

Figure 4A:
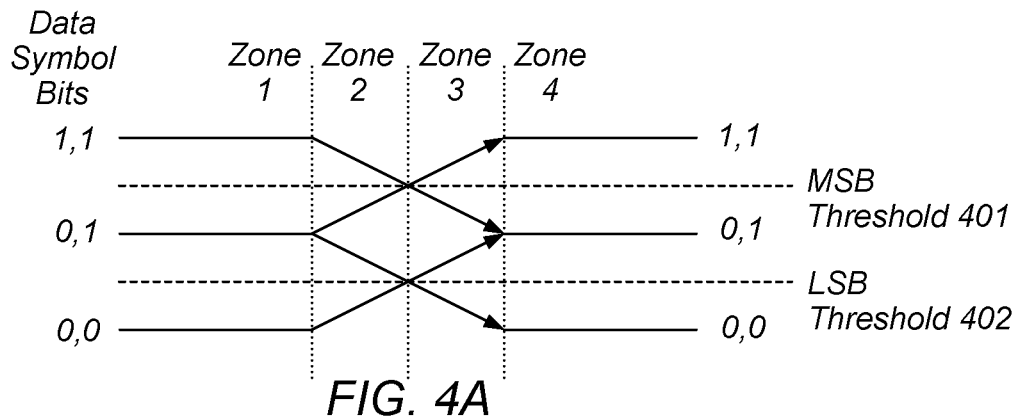
FIG. 4A is a diagram depicting an example of minor crossings for data state transitions for an input signal transmitted on a communication bus.

A diagram depicting examples of minor crossing in data state transitions in a serial communication bus signal is depicted in FIG. 4A. As illustrated, there are four possible minor crossings. As used herein, a minor crossing is a crossing from one data state to another that results in a change in the voltage level of the transmitted signal between adjacent voltage levels. In other words, a minor crossing will only traverse MSB threshold 401 or LSB threshold 402, but not both.

The possible minor crossings include a transition from data symbol bits 1,1 to data symbol bits 0,1, and a transition from data symbol bits 0, 1 to data symbol bits 1,1. Additionally, the minor crossing include a transition from data symbol bits 0, 1 to data symbol bits 0,0, and a transition from data symbol bits 0,0 to data symbol bits 0,1.

Figure 4B:
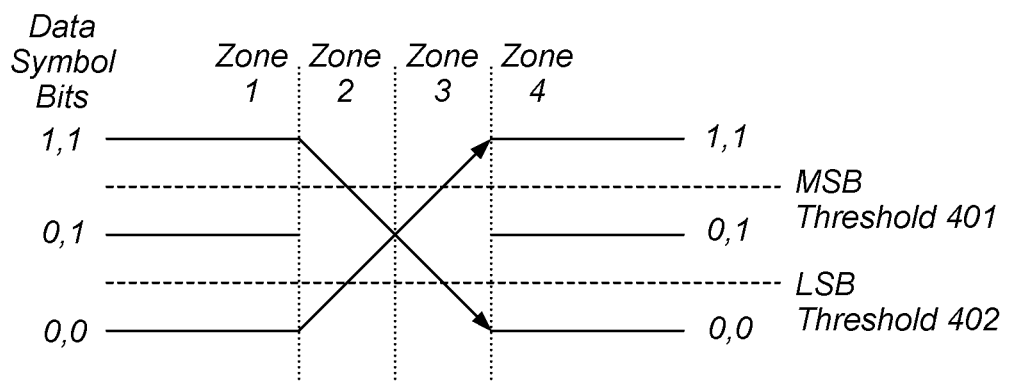
FIG. 4B is a diagram depicting an example of major crossings for data state transitions for an input signal transmitted on a communication bus.

Turning to FIG. 4B, a diagram depicting examples of major crossings in data state transitions in the serial communication bus signal is illustrated. As used herein, a major crossing is a crossing from one data state to another that results in a change of at least two voltage levels of the transmitted signal. In other words, a major crossing will traverse both MSB threshold 401 or LSB threshold 402.

As illustrated, there are two possible major crossings. The first major crossing is from data symbol bits 1,1 to data symbol bits 0,0. The second major crossing is from data symbol bits 0,0 to data symbol bits 1,1.

As described below, different densities may be assigned to different transitions using the different zones depicted in FIGS. 4A and 4B. It is noted that in the diagrams of FIGS. 4A and 4B, only two data symbol bits are illustrated. In other embodiments, any suitable number of data symbols bits and corresponding numbers of minor and major crossings may be employed.

Both the major crossings and the minor crossings across MSB threshold 401 activate early transition signals 114, which will result in activation of early signal 109. Since one of thresholds 116 corresponds to a voltage level associated with MSB threshold 401, phase detector circuit 100 will detect every major crossing as such transitions pass through MSB threshold 401.

In zones 1 and 4, phase detector circuit 100 is configured to activate one of early signal 109 or late signal 110. In zones 2 and 3, however, phase detector circuit 100 generates opposite phase decisions for a transition from data symbol bits 1,1→0,0, and for a transition from data symbol bits 0,0→1,1. This results in a dead zone to detect major crossings in zones 2 and 3. The dead zone, however, does not introduce any bias because the transitions 1,1→0,0 and 0,0→1,1 have equal probability (this is ensured by most data encoding schemes), and because the transitions 1,1→0,0 and 0,0→1,1 have similar edge rates due to the differential signaling employed in many serial communication protocols. A similar situation occurs in zones 2 and 3 for minor crossings across the LSB threshold 402.

The dead zones described above result in the major crossing being statistically "filtered" and not used in the generation of early signal 109 and late signal 110. This allows clock recovery circuits to lock to just the minor crossings instead of switching between major and minor crossings for locking, thereby improving the clock recovery process.

Figure 5:
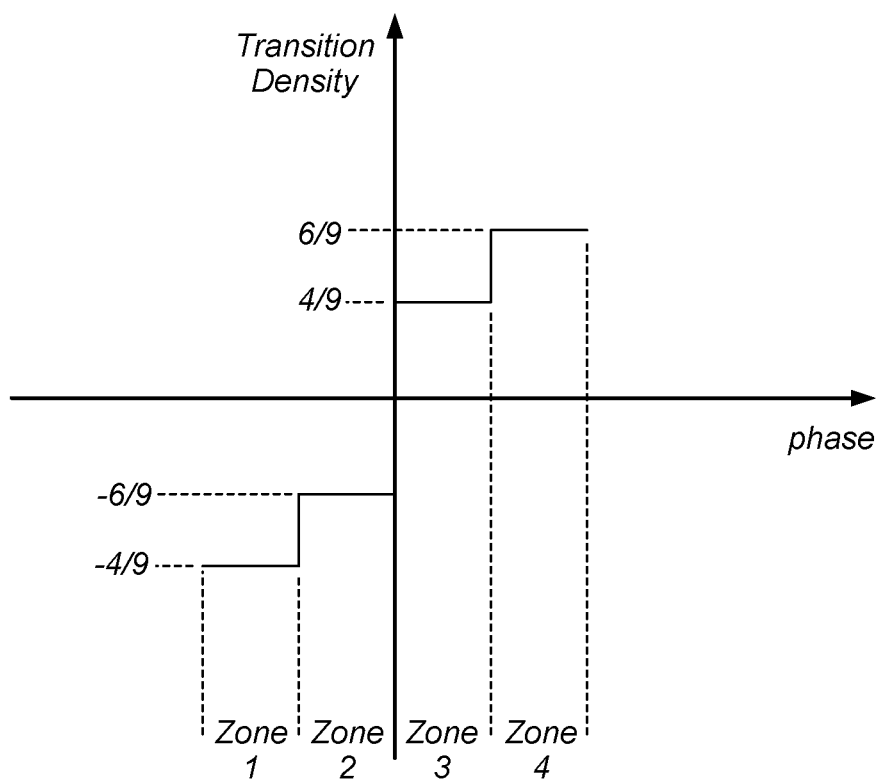
FIG. 5 is a diagram depicting transition density for an input signal transmitted on a communication bus.

A diagram depicting the transition density for phase detector circuit 100 is illustrated in FIG. 5. As depicted in FIGS. 4A and 4B, only minor crossings occur within zones 2 and 3. This results in a transition density of 4/9. When the phase error is large enough in zones 1 and 4, the major transitions are employed resulting in a transition density of 6/9. It is noted that the transition densities depicted in FIG. 5 are merely examples. In other embodiments, different communication protocols may be employed which can result in different transition densities.

Figure 6:
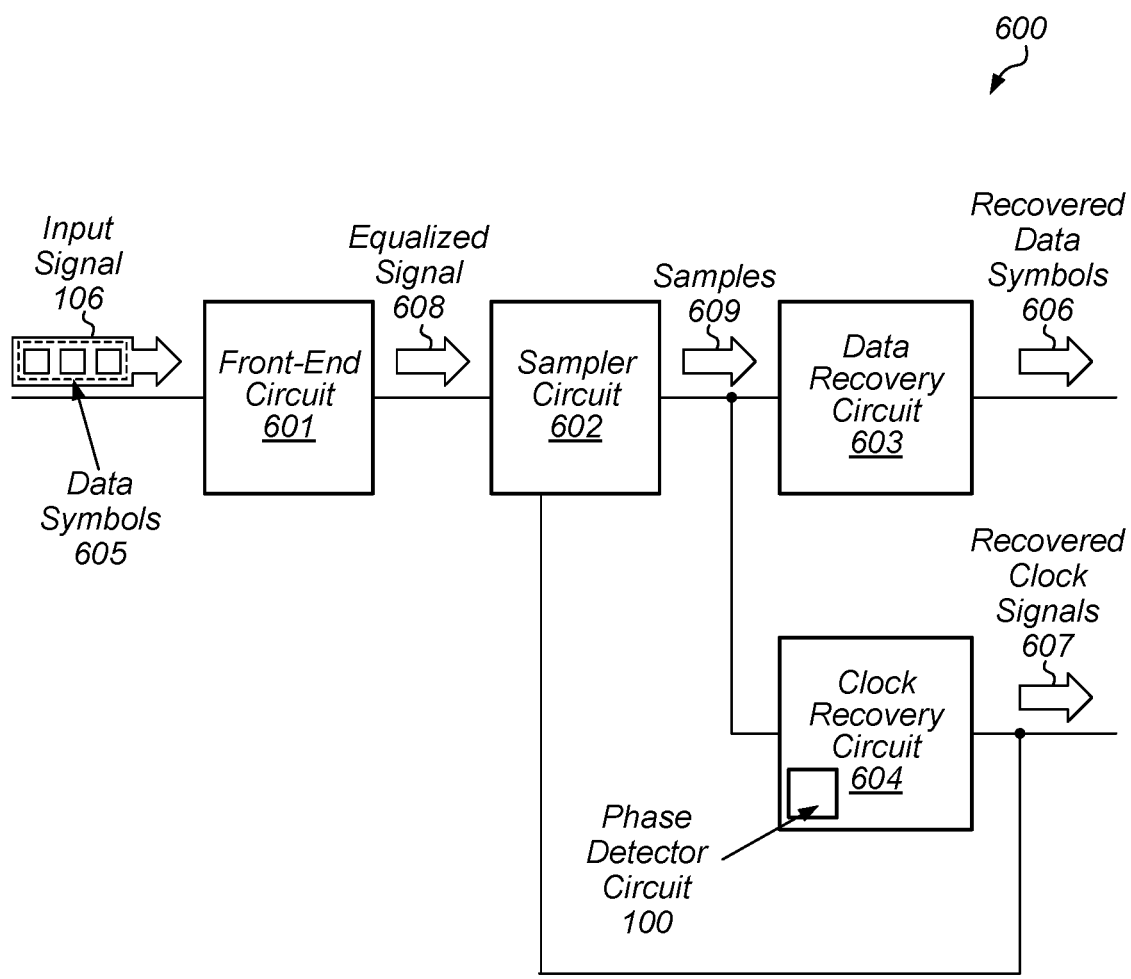
FIG. 6 is a block diagram of a receiver circuit that includes a phase detector circuit.

Turning to FIG. 6, a block diagram of an embodiment of a receiver circuit that includes a phase detector circuit is depicted. As illustrated, receiver circuit 600 includes front-end circuit 601, sampler circuit 602, data recovery circuit 603, and clock recovery circuit 604.

Front-end circuit 601 is configured to generate equalized signal 608 using input signal 106. In various embodiments, input signal 106 encodes data symbols 605 using any suitable communication protocol such as PAM3, PAM4, etc.

To generate equalized signal 608, front-end circuit 601 may be further configured to perform various operations such as filtering, automatic gain control, and the like.

Sampler circuit 602 is configured to generate samples 609 using equalized signal 608. In various embodiments, sampler circuit 602 may correspond to sampler circuit 101 as depicted in FIG. 1. In some embodiments, sampler circuit 602 may be further configured to use one or more of recovered clock signals 607 to generate samples 609 using equalized signal 608. In some embodiments, sampler circuit 602 may be implemented using one or more comparator circuits configured to compare a voltage level of equalized signal 608 to corresponding ones of threshold values (e.g., thresholds 116).

Data recovery circuit 603 is configured to generate recovered data symbols 606 using samples 609. It is noted that each of recovered data symbols 606 may correspond to a particular one of data symbols 605. In some cases, data recovery circuit 603 may be further configured to generate recovered data symbols 606 using one or more of recovered clock signals 607. In various embodiments, data recovery circuit 603 may be configured to perform a decision-feedback equalization operation as part of generating recovered data symbols 606. It is noted that there are numerous techniques by which data symbols can be recovered from samples 609 and that, in various embodiments, data recovery circuit 603 may be configured to employ any suitable technique for data recovery.

Clock recovery circuit 604 includes phase detector circuit 100 and is configured to generate recovered clock signals 607 using samples 609. In various embodiments, clock recovery circuit 604 may include an oscillator circuit whose phase and/or frequency is adjusted using samples 609. In some cases, the phase of the oscillator circuit may be adjusted using early signal 109 and late signal 110. It is noted that, depending on the frequency of the signal generated by oscillator circuit, a frequency divider circuit may be employed.

It is noted that the receiver circuit depicted in FIG. 6 is merely an example. In other embodiments, different circuit blocks, e.g., a decision-feedback equalization circuit, may be included in receiver circuit 600.

Figure 7:
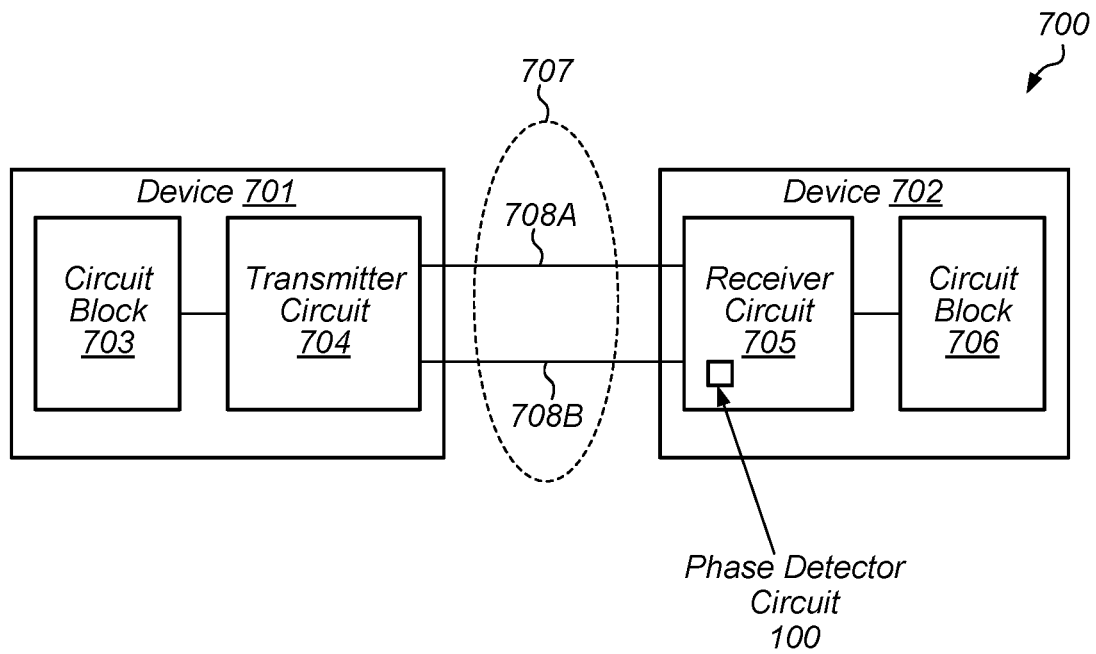
FIG. 7 is a block diagram of an embodiment of a communication subsystem for a computer system.

As described above, a receiver circuit that includes a sampler circuit, such as phase detector circuit 100, may be employed in a computer system. A block diagram of an embodiment of such a computer system is depicted in FIG. 7. As illustrated, computer system 700 includes devices 701 and 702, coupled by communication bus 707.

Device 701 includes circuit block 703 and transmitter circuit 704. In various embodiments, device 701 may be a processor circuit, a processor core, a memory circuit, or any other suitable circuit block that may be included on an integrated circuit in a computer system. It is noted that although device 701 only depicts a single circuit block and a single transmitter circuit, in other embodiments, additional circuit blocks and additional transmitter circuits may be employed.

Transmitter circuit 704 is configured to serially transmit signals, via communication bus 707, corresponding to data received from circuit block 703. Such signals may differentially encode one or more bits such that a difference between the respective voltage levels of wires 708A and 708B, at a particular point in time, correspond to a particular bit value. In some cases, the generation of the signals may include encoding the bits prior to transmission. It is noted that although communication bus 707 is depicted as including two wires, in other embodiments, any suitable number of wires may be employed.

Device 702 includes receiver circuit 705 and circuit block 706. Like device 701, device 702 may be a processor circuit, a processor core, a memory circuit, or any other suitable circuit block configured to receive data from transmitter circuit 704. Receiver circuit 705 includes phase detector circuit 100 that is configured to perform operations as described above.

Devices 701 and 702 may, in some embodiments, be fabricated on a common integrated circuit. In other embodiments, devices 701 and 702 may be located on different integrated circuits mounted on a common substrate or circuit board. In such cases, communication bus 707 may include metal or other conductive traces on the substrate or circuit board. Although only two devices are depicted in computer system 700, in other embodiments, any suitable number of devices may be employed.

Various embodiments for detecting phase differences between sample clocks and transitions in a serial data stream on a communication bus are disclosed. Broadly speaking, a sample circuit may be configured to sample, at a first time point, an input signal that encodes a plurality of data symbols to generate an edge sample. The sample circuit may be further configured to sample the input signal at a second time point subsequent to the first time point to generate a current data sample that corresponds to a given one of the plurality of data symbols. A particular phase circuit may be configured to generate a plurality of early transition signals using the edge sample and the current data sample, and a different phase circuit may be configured to generate a plurality of late transition signals using the edge sample and a previous data sample. A particular logic circuit may be configured to combine the plurality of early transition signals to generate an early phase signal, and a different logic circuit may be configured to combine the plurality of late transition signals to generate a late phase signal.

Figure 8:
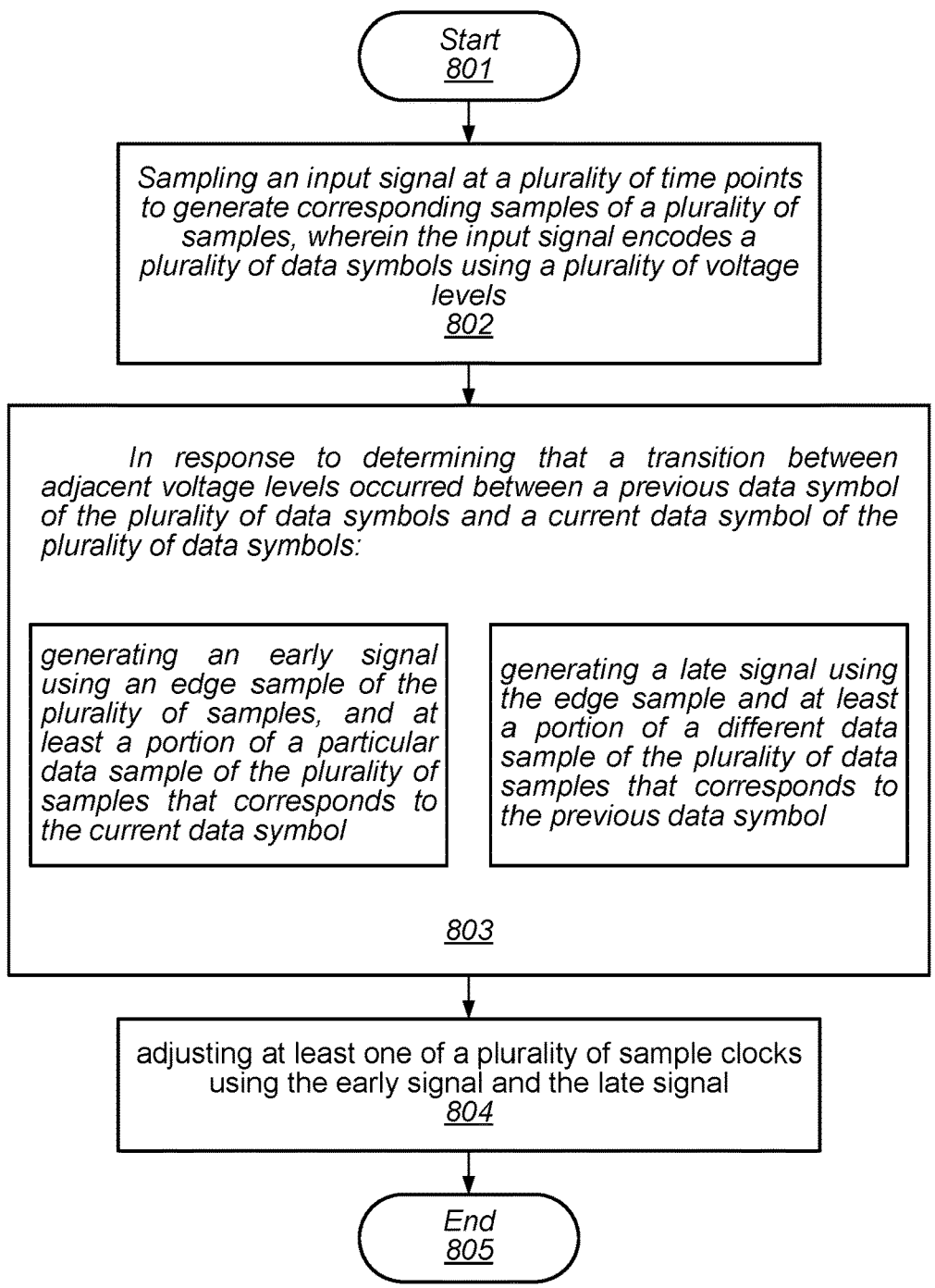
FIG. 8 is a flow diagram of an embodiment of a method for operating a phase detector circuit.

Turning to FIG. 8, a flow diagram depicting an embodiment of a method for operating a phase detector circuit is illustrated. The method, which may be applied to various phase detector circuits such as phase detector circuit 100, begins in block 801.

The method includes sampling an input signal at a plurality of time points to generate corresponding samples of a plurality of samples, wherein the input signal encodes a plurality of data symbols using a plurality of voltage levels (block 802). In various embodiments, sampling the input signal includes performing, at the plurality of time points, a comparison of a voltage level of the input signal to a plurality of threshold values.

The method further includes, in response to determining that a transition between adjacent voltage levels occurred between a previous data symbol of the plurality of data symbols and a current data symbol of the plurality of data symbols: generating an early signal using an edge sample of the plurality of samples, and at least a portion of a particular data sample of the plurality of samples that corresponds to the current data symbol, and generating a late signal using the edge sample and at least a portion of a different data sample of the plurality of data samples that corresponds to the previous data symbol (block 803). It is noted that, in various embodiments, generating the early signal and generating the late signal may be performed concurrently.

In some embodiments, the edge sample includes a first plurality of bits and the particular data sample includes a second plurality of bits. In various embodiments, generating the early signal includes performing a first comparison of a most-significant-bit of the first plurality of bits and a most significant-bit of the second plurality of bits, and generating a first early transition signal using a result of the first comparison. The method may additionally include performing a second comparison of a least-significant-bit of the first plurality of bits and a least-significant-bit of the second plurality of bits, and generating a second early transition signal using a result of the second comparison.

In various embodiments, the different data sample corresponds to a data symbol received prior to the current data symbol and includes a third plurality of bits. In such cases, generating the late signal includes performing a first comparison of a most-significant-bit of the first plurality of bits and a most significant-bit of the second plurality of bits, and generating a first late transition signal using a result of the first comparison. The method may additionally include performing a second comparison of a least-significant-bit of the first plurality of bits and a least-significant-bit of the second plurality of bits, and generating a second late transition signal using a result of the second comparison.

In some embodiments, performing the first comparison includes performing an exclusive-OR operation using the most-significant-bit of the first plurality of bits and the most significant-bit of the second plurality of bits, and latching a result of the exclusive-OR operation using a particular sample clock of the plurality of sample clocks.

In some embodiments, the method may further include performing a logical-OR operation using the first early transition signal and the second early transition signal to generate the early signal, and re-timing the early signal. In other embodiments, the method may further include performing a logical-OR operation of the first late transition signal and the second late transition signal to generate the late signal, and re-timing the late signal.

The method also includes adjusting at least one of a plurality of sample clocks using the early signal and the late signal (block 804). The method concludes in block 805.

Figure 9:
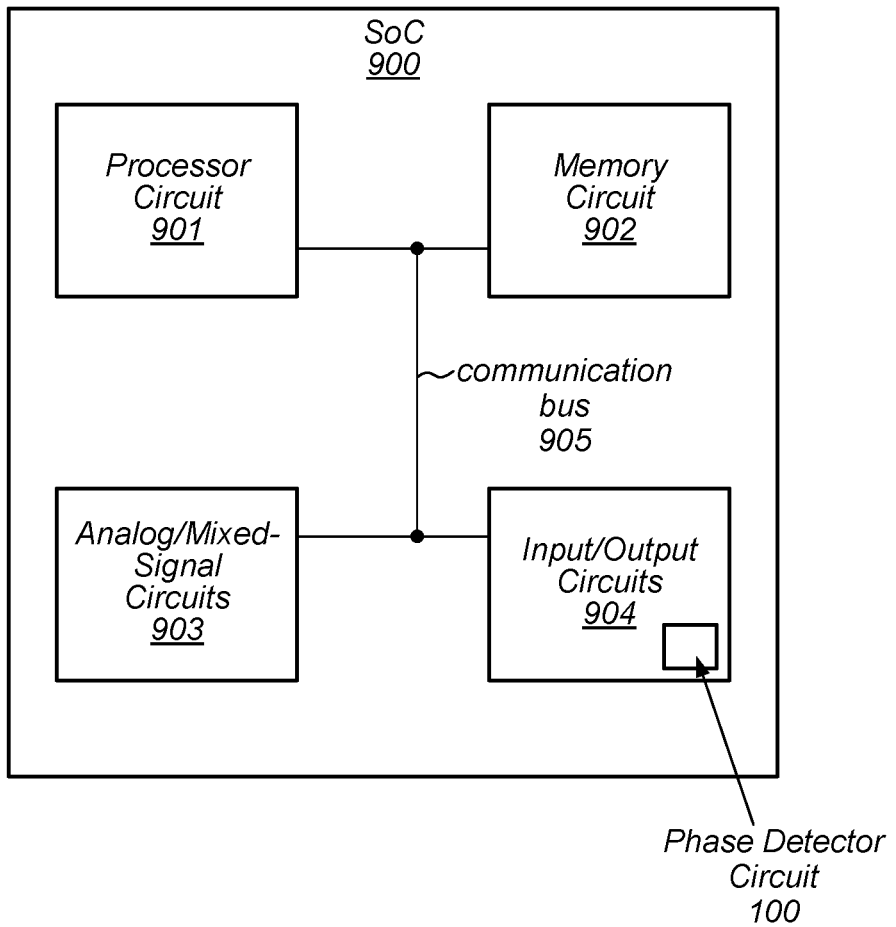
FIG. 9 is a block diagram of one embodiment of a system-on-a-chip that includes a sampler circuit.

A block diagram of a system-on-a-chip (SoC) is illustrated in FIG. 9. In the illustrated embodiment, SoC 900 includes processor circuit 901, memory circuit 902, analog/mixed-signal circuits 903, and input/output circuits 904, each of which is coupled to communication bus 905. In various embodiments, SoC 900 may be configured for use in a desktop computer, server, or in a mobile computing application such as, e.g., a tablet, laptop computer, or wearable computing device.

Processor circuit 901 may, in various embodiments, be representative of a general-purpose processor that performs computational operations. For example, processor circuit 901 may be a central processing unit (CPU) such as a microprocessor, a microcontroller, an application-specific integrated circuit (ASIC), or a field-programmable gate array (FPGA).

Memory circuit 902 may, in various embodiments, include any suitable type of memory such as Dynamic Random-Access Memory (DRAM), Static Random-Access Memory (SRAM), Read-Only Memory (ROM), Electrically Erasable Programmable Read-only Memory (EEPROM), or non-volatile memory, for example. It is noted that although a single memory circuit is illustrated in FIG. 9, in other embodiments, any suitable number of memory circuits may be employed.

Analog/mixed-signal circuits 903 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 903 may be configured to perform power management tasks with the inclusion of on-chip power supplies and voltage regulator circuits.

Input/output circuits 904, which may include phase detector circuit 100, may be configured to coordinate data transfer between SoC 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between SoC 900 and one or more devices (e.g., other computing systems or integrated circuits) coupled to SoC 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Figure 10:
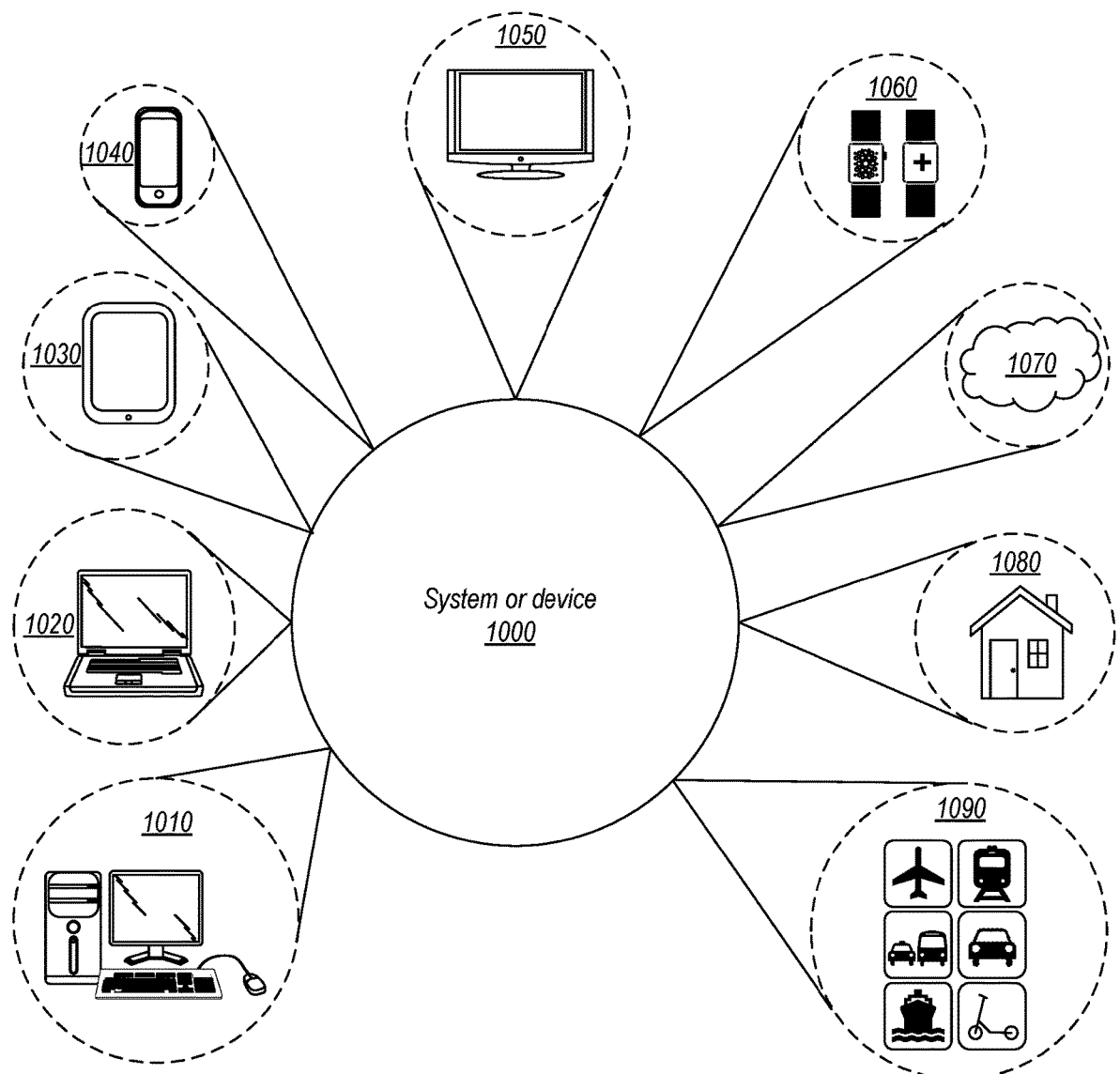
FIG. 10 is a block diagram of various embodiments of computer systems that may include sampler circuits.

Turning now to FIG. 10, various types of systems that may include any of the circuits, devices, or systems discussed above are illustrated. System or device 1000, which may incorporate or otherwise utilize one or more of the techniques described herein, may be utilized in a wide range of areas. For example, system or device 1000 may be utilized as part of the hardware of systems such as a desktop computer 1010, laptop computer 1020, tablet computer 1030, cellular or mobile phone 1040, or television 1050 (or set-top box coupled to a television).

Similarly, disclosed elements may be utilized in a wearable device 1060, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1000 may also be used in various other contexts. For example, system or device 1000 may be utilized in the context of a server computer system, such as a dedicated server or on shared hardware that implements a cloud-based service 1070. Still further, system or device 1000 may be implemented in a wide range of specialized everyday devices, including devices 1080 commonly found in the home such as refrigerators, thermostats, security cameras, etc. The interconnection of such devices is often referred to as the "Internet of Things" (IoT). Elements may also be implemented in various modes of transportation. For example, system or device 1000 could be employed in the control systems, guidance systems, entertainment systems, etc. of various types of vehicles 1090.

The applications illustrated in FIG. 10 are merely exemplary and are not intended to limit the potential future applications of disclosed systems or devices. Other example applications include, without limitation: portable gaming devices, music players, data storage devices, unmanned aerial vehicles, etc.

Figure 11:
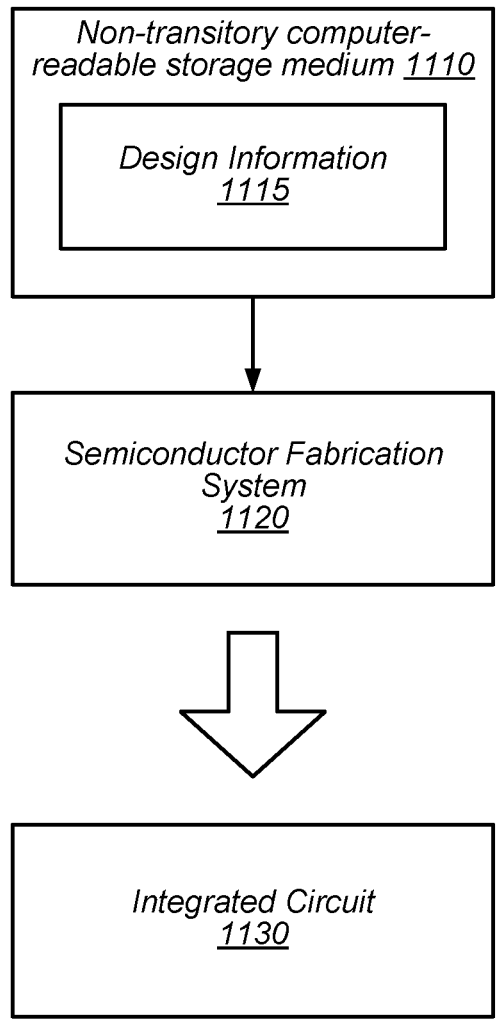
FIG. 11 illustrates an example of a non-transitory computer-readable storage medium that stores circuit design information.

FIG. 11 is a block diagram illustrating an example of a non-transitory computer-readable storage medium that stores circuit design information, according to some embodiments. In the illustrated embodiment, semiconductor fabrication system 1120 is configured to process design information 1115 stored on non-transitory computer-readable storage medium 1110 and fabricate integrated circuit 1130 based on design information 1115.

Non-transitory computer-readable storage medium 1110 may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums, which may reside in different locations, e.g., in different computer systems that are connected over a network.

Design information 1115 may be specified using any of various appropriate computer languages, including hardware description languages such as, without limitation: VHDL, Verilog, SystemC, System Verilog, RHDL, M, MyHDL, etc. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor-level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor-level netlists. As used herein, mask design data may be formatted according to a graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third," when applied to a particular feature, do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a sample circuit configured to:
      sample an input signal at a first time point to generate an edge sample, wherein the input signal encodes a plurality of data symbols; and
      sample the input signal at a second time point subsequent to the first time point to generate a current data sample that corresponds to a given one of the plurality of data symbols;
   a particular phase circuit configured to generate a plurality of early transition signals using the edge sample and the current data sample;
   a different phase circuit configured to generate a plurality of late transition signals using the edge sample and a previous data sample;
   a particular logic circuit configured to combine the plurality of early transition signals to generate an early phase signal; and
   a different logic circuit configured to combine the plurality of late transitions signals to generate a late phase signal.

2. The apparatus of claim 1, wherein to sample the input signal at the first time point, the sample circuit is configured to:
   perform, at the first time point, a comparison of a voltage level of the input signal to a plurality of threshold values; and
   generate, using results of the comparison, the edge sample.

3. The apparatus of claim 1, wherein the edge sample includes a first plurality of bits and the current data sample includes a second plurality of bits, and wherein to generate the early phase signal, the particular phase circuit is configured to:
   perform a first comparison of a most-significant-bit of the first plurality of bits and a most significant-bit of the second plurality of bits;
   generate a first early transition signal using a result of the first comparison;
   perform a second comparison of a least-significant-bit of the first plurality of bits and a least-significant-bit of the second plurality of bits; and generate a second early transition signal using a result of the second comparison.

4. The apparatus of claim 3, wherein the particular phase circuit is further configured to:
perform a logical-OR operation of the first early transition signal and the second early transition signal to generate the early phase signal; and
re-time the early phase signal.

5. The apparatus of claim 1, wherein the edge sample includes a first plurality of bits and the previous data sample includes a second plurality of bits, and wherein to generate the late phase signal, the different phase circuit is further configured to:
perform a first comparison of a most-significant-bit of the first plurality of bits and a most significant-bit of the second plurality of bits;
generate a first late transition signal using a result of the first comparison;
perform a second comparison of a least-significant-bit of the first plurality of bits and a least-significant-bit of the second plurality of bits; and
generate a second late transition signal using a result of the second comparison.

6. The apparatus of claim 1, further comprising a clock generator circuit configured to:
generate a plurality of sample clocks; and
adjust a phase of at least one of the plurality of sample clocks using the early phase signal or the late phase signal.

7. A method, comprising:
sampling an input signal at a plurality of time points to generate corresponding samples of a plurality of samples, wherein the input signal encodes a plurality of data symbols using a plurality of voltage levels;
in response to determining that a transition between adjacent voltage levels occurred between a previous data symbol of the plurality of data symbols and a current data symbol of the plurality of data symbols:
generating an early signal using an edge sample of the plurality of samples, and at least a portion of a particular data sample of the plurality of samples that corresponds to the current data symbol; and
generating a late signal using the edge sample and at least portion of a different data sample of the plurality of samples that corresponds to the previous data symbol; and
adjusting at least one of a plurality of sample clocks using the early signal and the late signal.

8. The method of claim 7, wherein sampling the input signal includes:
performing, at the plurality of time points, a comparison of a voltage level of the input signal to a plurality of threshold values; and
generating the plurality of samples using results of the comparison.

9. The method of claim 7, wherein the edge sample includes a first plurality of bits and the particular data sample includes a second plurality of bits, and wherein generating the early signal includes:
performing a first comparison of a most-significant-bit of the first plurality of bits and a most significant-bit of the second plurality of bits;
generating a first early transition signal using a result of the first comparison;
performing a second comparison of a least-significant-bit of the first plurality of bits and a least-significant-bit of the second plurality of bits; and
generating a second early transition signal using a result of the second comparison.

10. The method of claim 9, further comprising:
performing a logical-OR operation using the first early transition signal and the second early transition signal to generate the early signal; and
re-timing the early signal.

11. The method of claim 7, wherein the edge sample includes a first plurality of bits and the different data sample includes a second plurality of bits, and wherein generating the late signal includes:
performing a first comparison of a most-significant-bit of the first plurality of bits and a most significant-bit of the second plurality of bits;
generating a first late transition signal using a result of the first comparison;
performing a second comparison of a least-significant-bit of the first plurality of bits and a least-significant-bit of the second plurality of bits; and
generating a second late transition signal using a result of the second comparison.

12. The method of claim 11, wherein performing the first comparison includes:
performing an exclusive-OR operation using the most-significant-bit of the first plurality of bits and the most significant-bit of the second plurality of bits; and
latching a result of the exclusive-OR operation using a particular sample clock of the plurality of sample clocks.

13. The method of claim 11, further comprising:
performing a logical-OR operation of the first late transition signal and the second late transition signal to generate the late signal; and
re-timing the late signal.

14. An apparatus, comprising:
a first device configured to transmit, via a communication bus, a signal that encodes a plurality of data symbols; and
a second device coupled to the communication bus, wherein the second device is configured to:
sample the signal at a plurality of time points to generate corresponding samples of a plurality of samples, wherein the signal encodes a plurality of data symbols using a plurality of voltage levels;
in response to a determination that a transition between adjacent voltage levels occurred between a previous data symbol of the plurality of data symbols and a current data symbol of the plurality of data symbols:
generate an early signal using an edge sample of the plurality of samples, and at least a portion of a particular data sample of the plurality of samples that corresponds to the current data symbol; and
generate a late signal using the edge sample and at least a portion of a different data sample of the plurality of samples that corresponds to the previous data symbol; and
adjust at least one of a plurality of sample clocks using the early signal and the late signal.

15. The apparatus of claim 14, wherein to sample the signal, the second device is further configured to:
perform, at the plurality of time points, a comparison of a voltage level of the signal to a plurality of threshold values; and
generate the plurality of samples using results of the comparison.

16. The apparatus of claim 14, wherein the edge sample includes a first plurality of bits, and the particular data sample includes a second plurality of bits, and wherein to generate the early signal, the second device is further configured to:

perform a first comparison of a most-significant-bit of the first plurality of bits and a most significant-bit of the second plurality of bits;

generate a first early transition signal using a result of the first comparison;

perform a second comparison of a least-significant-bit of the first plurality of bits and a least-significant-bit of the second plurality of bits; and generate a second early transition signal using a result of the second comparison.

17. The apparatus of claim 16, wherein the second device is further configured to:

perform a logical-OR operation of the first early transition signal and the second early transition signal to generate the early signal; and re-time the early signal.

18. The apparatus of claim 17, wherein the edge sample includes a first plurality of bits, and the different data sample includes a second plurality of bits, and wherein to generate the late signal, the second device is further configured to:

perform a first comparison of a most-significant-bit of the first plurality of bits and a most significant-bit of the second plurality of bits;

generate a first late transition signal using a result of the first comparison;

perform a second comparison of a least-significant-bit of the first plurality of bits and a least-significant-bit of the second plurality of bits; and generate a second late transition signal using a result of the second comparison.

19. The apparatus of claim 18, wherein to perform the first comparison, the second device is further configured to:

perform an exclusive-OR operation using the most-significant-bit of the first plurality of bits and the most significant-bit of the second plurality of bits; and latch a result of the exclusive-OR operation using a particular sample clock of the plurality of sample clocks.

20. The apparatus of claim 18, wherein the second device is further configured to:

perform a logical-OR operation of the first late transition signal and the second late transition signal to generate the late signal; and re-time the late signal.

\* \* \* \* \*